US010699990B2

(12) United States Patent
Ng

(10) Patent No.: US 10,699,990 B2
(45) Date of Patent: Jun. 30, 2020

(54) INTEGRATED CIRCUIT DEVICE WITH PLATING ON LEAD INTERCONNECTION POINT AND METHOD OF FORMING THE DEVICE

(71) Applicant: STMICROELECTRONICS SDN BHD, Muar (MY)

(72) Inventor: Cheeyang Ng, Muar (MY)

(73) Assignee: STMicroelectronics SDN BHD, Muar (MY)

( * ) Notice: Subject to any disclaimer, the term of this patent is extended or adjusted under 35 U.S.C. 154(b) by 0 days.

(21) Appl. No.: 16/058,045

(22) Filed: Aug. 8, 2018

(65) Prior Publication Data

US 2018/0350728 A1    Dec. 6, 2018

Related U.S. Application Data

(63) Continuation of application No. 14/565,686, filed on Dec. 10, 2014, now Pat. No. 10,062,639.

(51) Int. Cl.
*H01L 23/495* (2006.01)
*H01L 23/00* (2006.01)
*H01L 23/31* (2006.01)

(52) U.S. Cl.
CPC .... *H01L 23/49541* (2013.01); *H01L 23/3142* (2013.01); *H01L 23/4952* (2013.01); *H01L 23/49575* (2013.01); *H01L 23/49582* (2013.01); *H01L 24/49* (2013.01); *H01L 24/85* (2013.01); *H01L 23/3107* (2013.01); *H01L 23/49513* (2013.01); *H01L 24/45* (2013.01); *H01L 24/48* (2013.01); *H01L 2224/45015* (2013.01); *H01L 2224/45139* (2013.01); *H01L 2224/45144* (2013.01); *H01L 2224/45147* (2013.01); *H01L 2224/48245* (2013.01); *H01L 2924/00014* (2013.01); *H01L 2924/01047* (2013.01);

(Continued)

(58) Field of Classification Search
CPC .............. H01L 23/49541; H01L 24/49; H01L 23/49582; H01L 23/3107; H01L 1/4821; H01L 24/85; H01L 21/56; H01L 21/4842; H01L 23/49816; H01L 23/49838; H01L 23/4985; H01L 23/50; H01L 24/86
USPC .................. 257/676, 667; 438/123, 121, 122
See application file for complete search history.

(56) References Cited

U.S. PATENT DOCUMENTS

| | | | |
|---|---|---|---|
| 5,939,774 | A | 8/1999 | Yamada |
| 7,692,283 | B2 | 4/2010 | Bauer et al. |

(Continued)

FOREIGN PATENT DOCUMENTS

| | | |
|---|---|---|
| CN | 1306676 A | 8/2001 |
| CN | 101405862 A | 4/2009 |
| CN | 102738108 A | 10/2012 |

*Primary Examiner* — Mouloucoulaye Inoussa
(74) *Attorney, Agent, or Firm* — Slater Matsil, LLP

(57) ABSTRACT

An integrated circuit (IC) device includes an IC die and a plurality of leads. Each lead includes an unplated proximal end including a first material, and an unplated distal end including the first material. A plated bond wire portion extends between the proximal and distal ends and includes the first material and a plating of a second material thereon. A plurality of bond wires extend between the IC die and the plated bond wire portions of the leads. An encapsulation material surrounds the IC die and bond wires so that the unplated proximal end and plated bond wire portion of each lead are covered by the encapsulation material.

20 Claims, 8 Drawing Sheets

(52) U.S. Cl.
CPC ... *H01L 2924/14* (2013.01); *H01L 2924/1711* (2013.01); *H01L 2924/17738* (2013.01); *H01L 2924/17747* (2013.01); *H01L 2924/20641* (2013.01); *H01L 2924/20642* (2013.01); *H01L 2924/20643* (2013.01); *H01L 2924/20644* (2013.01); *H01L 2924/20645* (2013.01)

(56) References Cited

U.S. PATENT DOCUMENTS

| | | | |
|---|---|---|---|
| 2002/0133943 A1* | 9/2002 | Sakamoto | H01L 21/4821 29/846 |
| 2005/0258521 A1 | 11/2005 | Park et al. | |
| 2008/0067698 A1 | 3/2008 | Do et al. | |
| 2010/0187678 A1* | 7/2010 | Kajiwara | H01L 21/56 257/692 |
| 2012/0248589 A1 | 10/2012 | Wang et al. | |
| 2014/0124912 A1 | 5/2014 | Kaneda | |

\* cited by examiner

FAILURE MODE: WELD NECK BREAK

10μm

INTEGRATED CIRCUIT DEVICE WITH PLATING ON LEAD INTERCONNECTION POINT AND METHOD OF FORMING THE DEVICE

CROSS-REFERENCE TO RELATED APPLICATIONS

This application claims the benefit under 35 U.S.C. § 120 of U.S. patent application Ser. No. 14/565,686, filed Dec. 10, 2014, and entitled "Integrated Circuit Device with Plating on Lead Interconnection Point and Method of Forming the Device," which application is hereby incorporated herein by reference.

TECHNICAL FIELD

The present invention relates to the field of integrated circuit devices, and more particularly, to integrated circuit packages with leads extending from the sides of the package and to leadless packages.

BACKGROUND

Integrated circuit packages, such as a quad flat package (QFP), small outline integrated circuit (SOC) package and plastic single small outline (PSSO) package include a die pad and an integrated circuit (or die) that is supported on the surface of the die pad. An encapsulating material surrounds the integrated circuit. A plurality of pins, often called leads, such as "gull wing" leads, usually extend from the sides of the encapsulating material forming the package. The leads are connected by bond wires to the encapsulated integrated circuit. Often these types of integrated circuit devices are formed as surface mounted devices. The package form may be a flat rectangular body and often is a square body with leads extending along all four sides. There are numerous design variations, which differ usually in the number of leads, their pitch, the package dimensions, and the materials used to construct the package. Materials often are selected to improve or vary the thermal characteristics of the package.

The encapsulating material is formed from a molding compound, such as an epoxy or other plastic material, that may sometimes not adhere well to the leads, in which case the molding compound forming the encapsulating material will separate from one or more of the leads. This separation can be induced by temperature changes and is known as delamination. It occurs usually at the point of internal stress at the end of the lead near the die where the bond wire is attached. For many packages the bond wire is formed of gold and the lead tips have been coated with silver to promote the wire bonding. The molding compound used for the encapsulating material usually bonds well with copper but does not bond well with silver and the delamination occurs between the molding compound and any silver coating and causes a wire bond failure from the delamination. Some packages replace the gold wire with a copper wire for cost saving but this creates a greater chance of lead tip delamination and causes a more severe wire bond failure.

SUMMARY

An integrated circuit (IC) device includes an IC die and a plurality of leads with each comprising an unplated proximal end comprising a first material, and an unplated distal end comprising the first material. A plated bond wire portion extends between the proximal and distal ends and includes the first material, and a plating of a second material thereon. A plurality of bond wires are included and extend between the IC die and the plated bond wire portions of the respective leads. An encapsulation material surrounds the IC die and the plurality of bond wires so that the unplated proximal end and plated bond wire portion of each lead are covered by the encapsulation material.

The IC device may include an unplated intermediate portion between the plated bond wire portion and the unplated distal end. In these embodiments, the encapsulation material may also cover the unplated intermediate portion of each lead.

The first material may comprise copper, and the second material may comprise silver, for example. Each of the plurality of bond wires may comprise the first material, for example. The bond wires can comprise copper. The unplated distal end may extend in a range of 100 to 300 microns, and the plated bond wire portion may extend in a range of 350 to 550 microns. Each lead may have a continuous shape devoid of openings, for example.

A method of making an integrated circuit (IC) device includes forming a plurality of leads with each lead including an unplated proximal end comprising a first material, and an unplated distal end comprising the first material. The plated bond wire portion is between the proximal and distal ends, and may include the first material and a plating of a second material thereon. The method may further include coupling a plurality of bond wires to an IC die and the plurality of leads so that each bond wire extends between the IC die and the plated bond wire portion of a respective lead. The encapsulation material may be formed to surround the IC die and bond wires so that the unplated proximal end and plated bond wire portion of each lead are covered by the encapsulation material.

DETAILED DESCRIPTION OF ILLUSTRATIVE EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
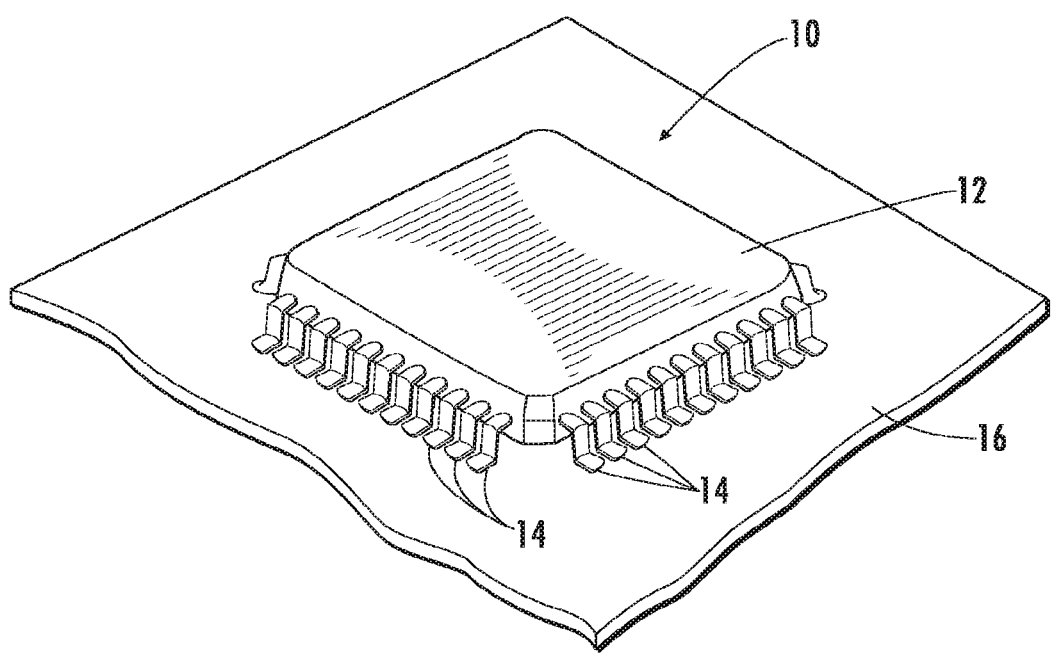
FIG. 1 is a perspective view of a prior art integrated circuit device formed as a surface mounted integrated circuit package with "gull wing" type leads.

FIG. 1 is a perspective view of a prior art integrated circuit device 10 formed in this example as a surface mounted integrated circuit (IC) package and as a quad flat package (QFP) that includes an encapsulating material 12 usually formed from a plastic material as a molding compound that surrounds the IC (not shown). A plurality of "gull wing" leads 14 are coupled to the encapsulated IC and extend outward from four sides of the package. The leads 14 are soldered to a circuit board 16. In the example of FIG. 1 the quad flat package includes a plurality of pins or leads 14 extending from each side of the package, which in this example is rectangular configured as a square body or package design. Commercial versions of quad flat packages range from packages often having from 32 to over 300 leads with a pitch ranging from 0.4 to 1.0 mm. They are often manufactured and marketed as a low profile quad flat package (LQFP) or a thin quad flat package (TQFP). Although much of the subject matter will be described relative to an example quad flat package, the integrated circuit device in accordance with the non-limiting examples can be formed as a number of different device configurations, including quad flat packages or other surface mount or integrated circuit packages and small outlined integrated circuit (SOIC) and plastic single small outline (PSSO) packages.

Figure 2:
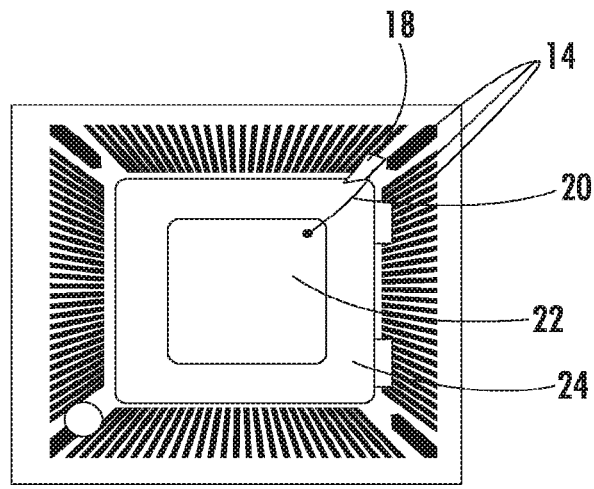
FIG. 2 is a plan view of another prior art integrated circuit device such as shown in FIG. 1 as an X-ray image and showing an example of lead tip delamination.

FIG. 2 is a plan view of a similar package 10 as in FIG. 1 using an x-ray image with the leads exiting from the package and showing an example of lead tip delamination at 18 and creating a bond wire 20 failure in the package. The IC die 22 is supported on the die pad 24 with an illustrated bond wire 18 connecting the IC 22 and lead 14.

Figure 3:
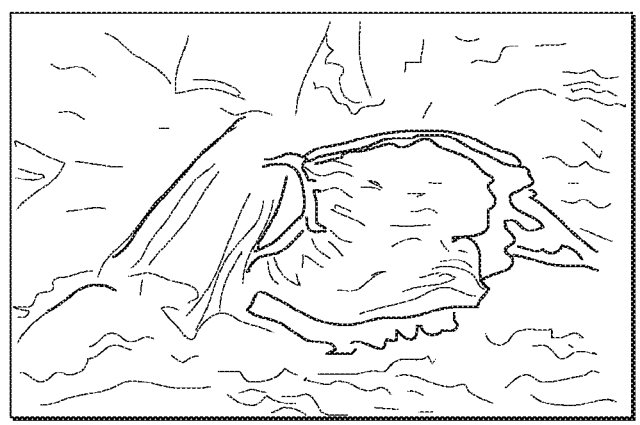
FIG. 3 is a microphotograph showing an example of a neck break on a lead within the prior art package such as in FIG. 2 created by the delamination.

FIG. 3 is an enlarged microphotograph of an example failure at the prior art lead tip such as shown in FIG. 2 from delamination created by lower elongation that occurs and is facilitated when the lead tip is delaminated, especially when copper wire is used in this example.

FIGS. 4 through 7 are prior art examples of different techniques applies to the tips of leads and used to minimize lead tip delamination. These examples all suffer some technical drawbacks leading to delamination as described below.

Figure 4:
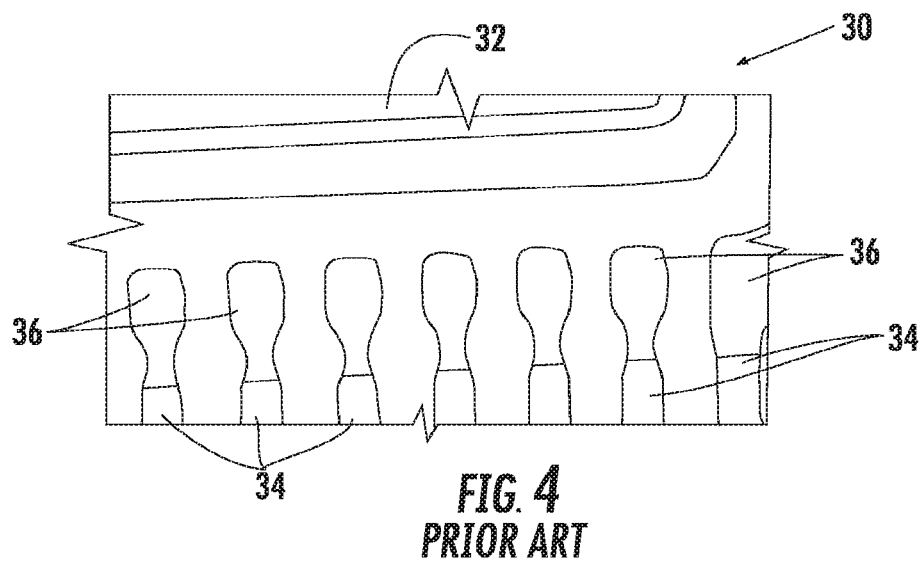
FIG. 4 is an enlarged view of a portion of a prior art package similar to that shown in FIG. 2 and showing full silver plating on the lead tips of each lead.

FIG. 4 is an example of a portion of a prior art package 30 having the IC 32 and leads 34, each with a silver plated lead tip 36 that is a compatible surface for wire bonding of silver, gold or copper bond wires (not shown). The drawback of the silver plated lead tip shown in FIG. 4 is that it is prone to lead tip 36 delamination especially when a short lead is used and requires more silver consumption, which can become prohibitively expensive with large packages.

Figure 5:
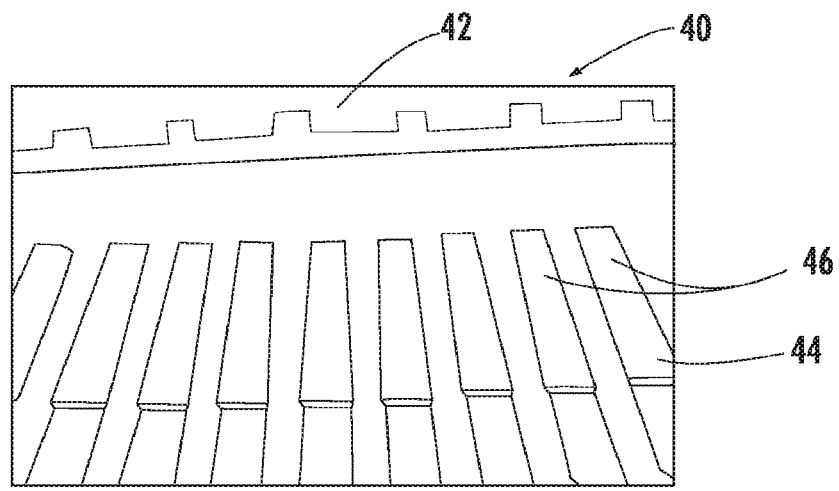
FIG. 5 is another enlarged view similar to that shown in FIG. 4 and showing an unplated copper lead as in the prior art.

FIG. 5 is another example of a prior art package 40 and portion of IC 42 showing a full uncoated copper lead 44 with an uncoated lead tip 46, which gives adhesion of copper via copper oxide for an encapsulation compound such as a plastic molding material. This type of lead 44 saves silver since there is no silver plating. Its drawbacks are the wire bonding challenges since bond wires are bondable to copper wire usually only when lead frame oxidation is controlled with the machine design and a staging control and refined procedures used during the wire bonding process. This adds cost to the final product.

Figure 6:
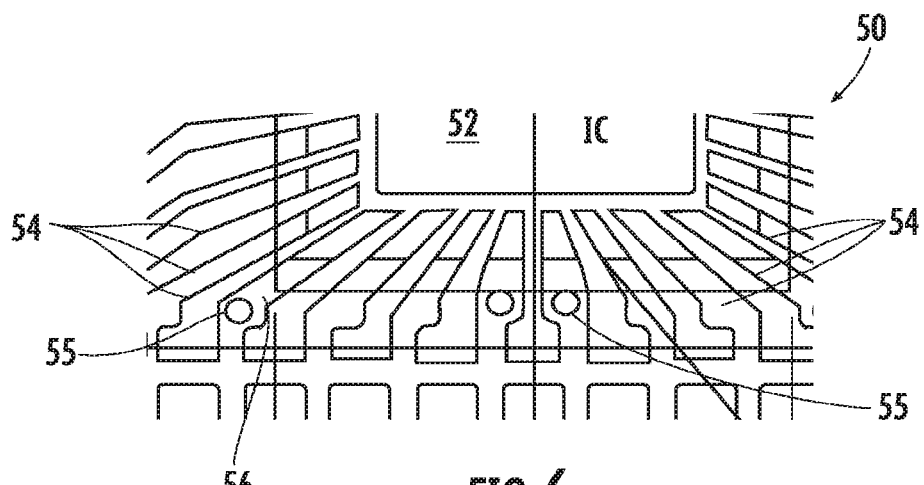
FIG. 6. is an example of prior art leads that include openings for mechanical locking of a bond wire onto the lead.

FIG. 6. is another example of a package 50 having an IC 52 and showing leads 54 with openings or holes 55 in the lead tip 56 for a mold compound to form a stronger mechanical bond. This type of system is advantageous because it forms a strong mechanical lock of a bond wire to the lead 54 but has the drawback of requiring a larger lead size and uses more lead area, such as requiring an increased lead width to accommodate the opening in the lead tip 56. It also requires an extra stamping step during manufacture, again increasing costs.

Figure 7:
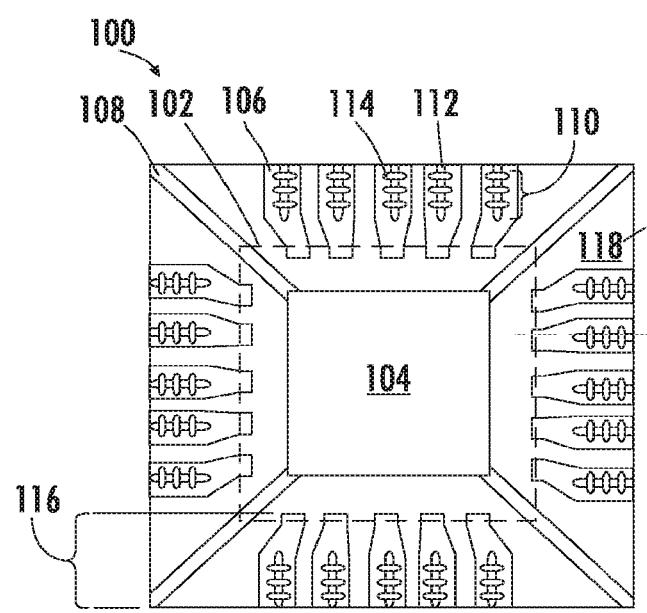
FIG. 7 is a plan view of a prior art integrated circuit package with an encapsulation lock formed on the leads.

Another prior art package is shown in FIG. 7 that uses a recess in the lead to form an encapsulation lock to lock a bond wire. An example is described in U.S. Patent Publication No. 2008/0067698.

This IC package 100 includes an integrated circuit die 102 over a paddle 104, such as die-attach paddle. The IC die 102 extends over a portion of external interconnects 106, such as leads, and tie bars 108. The tie bars 108 connect to the corners of the paddle 104.

Each of the external interconnects 106 has a recess 110, such as intersecting recess segments. The recess 110 is located towards an edge of the IC package 100. The recess 110 has a first recess segment 112 and a second recess segment 114. The first recess segment 112 is along a length-wise dimension 116 of the external interconnects 106. The second recess segment 114 is perpendicular to the first recess segment 112. The recess 110 has the first recess segment 112 and three instances of the second recess segment 114.

An encapsulation 118, such as an epoxy mold compound, covers the IC die 102, the paddle 104, the tie bars 108, and the external interconnects 106. The encapsulation 118 fills the recess 110 in the external interconnects 106 forming mold locks. The tie bars 108 and the paddle 104 also provide mold locks. The mold locks form structural reinforcement holding the encapsulation 118 in place. The mold locks help resist delamination of the encapsulation especially with the area where some bond wires may be located.

Although the recesses no form a tight encapsulation bond and resist delamination it includes particular manufacturing sequences to form the recesses that can add cost.

Figure 8:
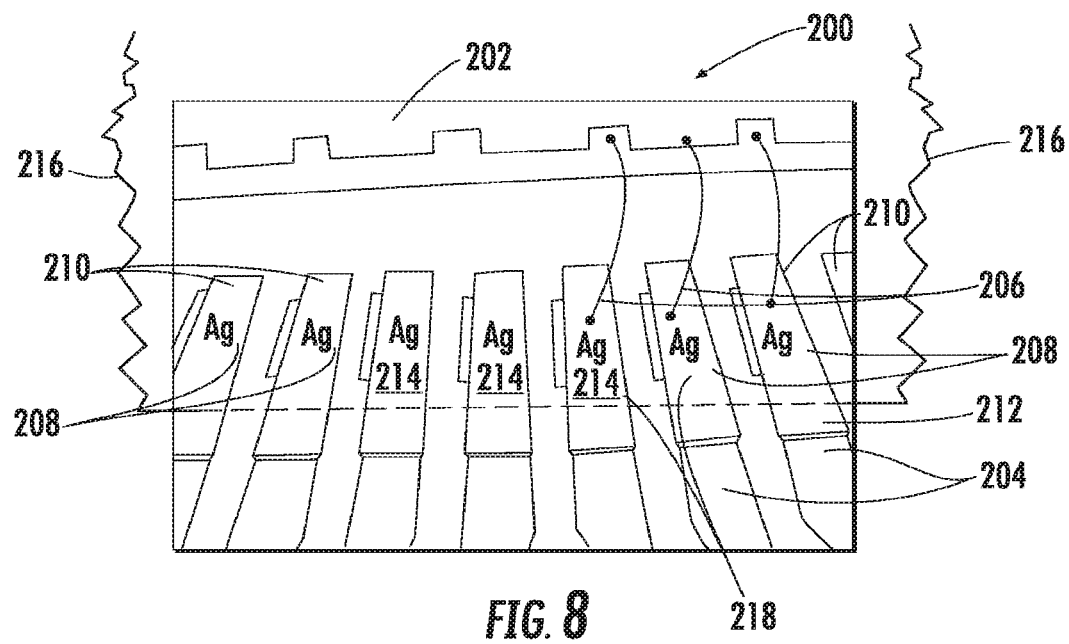
FIG. 8 is an enlarged view of a portion of the integrated circuit device in accordance with the non-limiting example showing a plated bond wire portion between the non-plated proximal and distal ends of the leads.

FIG. 8 is an example of a plurality of leads as part of the IC device 200 as a package similar to that shown in FIGS. 1 and 2 and the leads of FIG. 5 but having plated bond wires in accordance with a non-limiting example. The IC device 200 is shown in a fragmentary, plan view and includes an IC die 202 and the plurality of leads 204 and bond wires 206 extending between the IC die 202 and a lead 204. In this example, a bond wire 206 extends between the IC die 202 and plated bond wire portion 208 of a respective lead 204 as explained in detail below. Each lead 204 includes an unplated proximal end 210 that is formed of a first material and an unplated distal end 212 that is formed of the first material, such as formed of copper in one example. The plated bond wire portions 208 between the unplated proximal and distal ends 210, 212 each include the first material and a plating of a second material thereon as shown by the silver plating 214 on the copper lead 204. The encapsulation material 216 surrounds the IC die 202 and bond wires 206 as shown in the cut away view of the encapsulation material in FIG. 8, so that the unplated proximal end 210 and plated bond wire portion 208 of each lead 204 are covered by the encapsulation material, which is formed usually of a plastic molding compound or other material, such as an epoxy.

Each lead 204 further includes an unplated intermediate portion 218 adjacent the plated bond wire portion 208 and the unplated distal end 212. The encapsulation material 216 covers the unplated intermediate portion 218 of each lead 204. The first material can be formed of copper and the second material forming the plating can be silver as noted before. Each of the bond wires 206 can be formed of the first material such as copper. Other materials may be used and with leadless packages.

Figure 9:
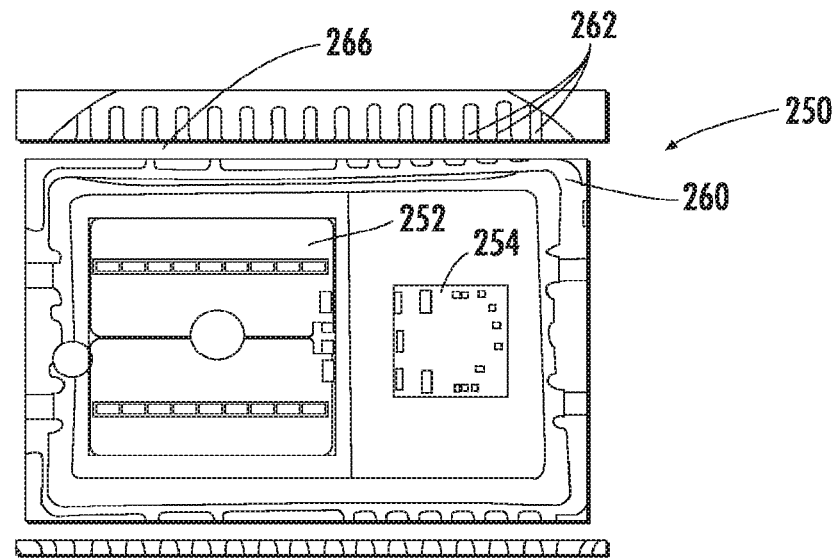
FIG. 9 is a schematic plan view of another integrated circuit device similar to that shown in FIG. 8 and showing an uncut silver strip applied along the leads in accordance with a non-limiting example.

FIG. 9 shows an example of an IC device as a partially manufactured package 250 and showing two IC's 252, 254 and lead frame 260 with leads 262 formed thereon.

During manufacturing a silver strip plating 266 is applied across the leads 262. The lead frame 260 is then cut and wire bonding occurs. A plated bond wire portion with the silver is thus formed.

Figure 10:
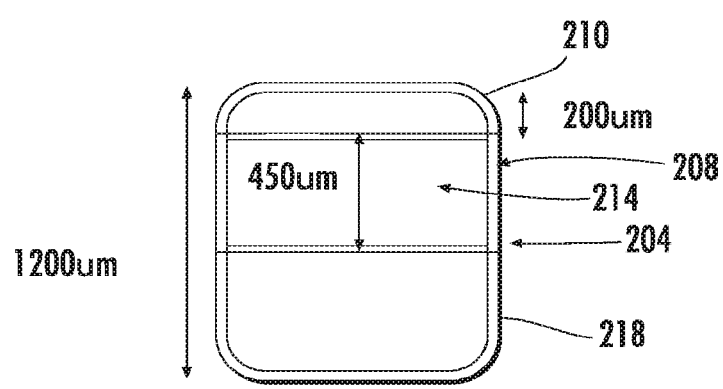
FIG. 10 is an example of a plastic single small outline (PSSO) package lead with a silver plating area on the copper lead and showing relative dimensions between the silver and copper in accordance with a non-limiting example.

FIG. 10 is an enlarged view of a portion of a lead 204 as in FIG. 8 and showing the unplated proximal end 210 extending about 100 to 300 microns and in this example 200 microns and each plated bond wire portion 208 extending about 350 to 550 microns and in this example 450 microns with the total length of toward the area where the encapsulation ends of about 1200 microns.

Each lead 204 is formed of a continuous shape that is devoid of openings so that the leads can be formed with a smaller width as compared to the leads shown in FIG. 6 having the hole for the mold compound to increase mechanical locking. Use of the plated bond wire portion combines with a good adhesion surface between the plated strip and provides a robust bond surface. With a copper bond wire there may be a longer wire that is stiffer than a gold wire but this is not seen as a critical issue.

Figure 11:
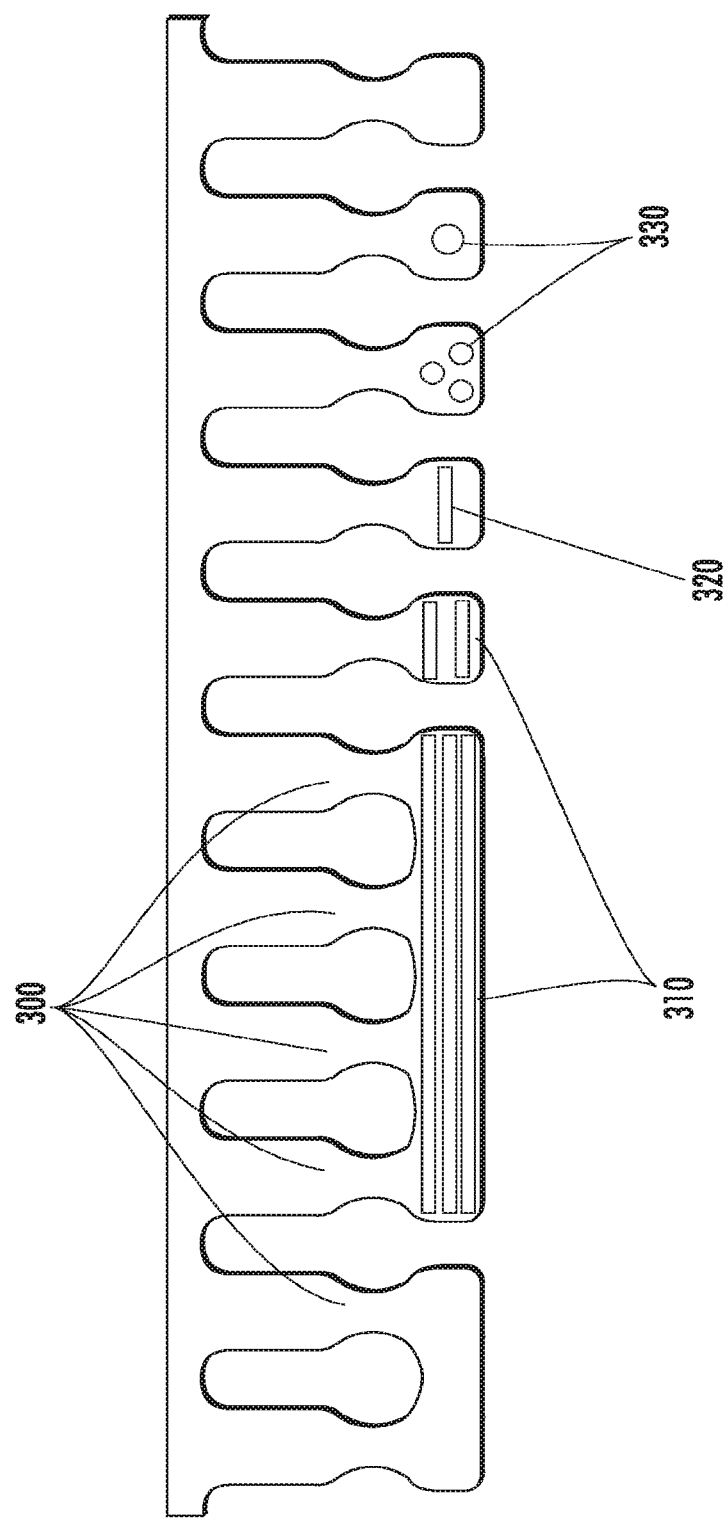
FIG. 11 is a schematic plan view of a portion of an integrated circuit device showing the leads and examples of multiple stripes as the plated bond wire portion and a single stripe and round coated spots as a plated wire portion in accordance with a non-limiting example.

FIG. 11 is a fragmentary plan view of another embodiment of an integrated circuit device showing different examples of plated bond wire portions and showing the leads 300 and in the example at the left, multiple stripes 310 that form the plated bond wire portion. A single strip 320 may form a plated bond wire portion as shown to the right of the multiple stripes 310. Round marks 330 as plated dots can form the plated bond wire portion and in this example, three marks or dots are illustrated at the left and on the right, a single mark or dot. The area in between the stripes 310 may give adhesion to a molding compound for package robustness and the stripes give the possibility for extra security for another material such as a bonding wire to adhere without increasing costs.

Figure 12:
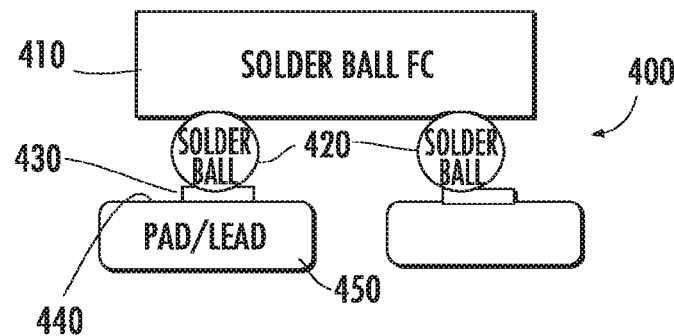
FIG. 12 is a fragmentary side sectional view of another integrated circuit device as a flip chip in accordance with a non-limiting example.

FIG. 12 is a fragmentary side sectional view of an integrated circuit device 400 formed as a solder ball flip chip device that includes the encapsulation 410 and solder balls 420 that connect to a plated bond wire portion 430 that is formed as a strip and is solder wetting friendly. The lead 450 includes a copper surface/molding compound adhesion friendly surface 440.

Figure 13:
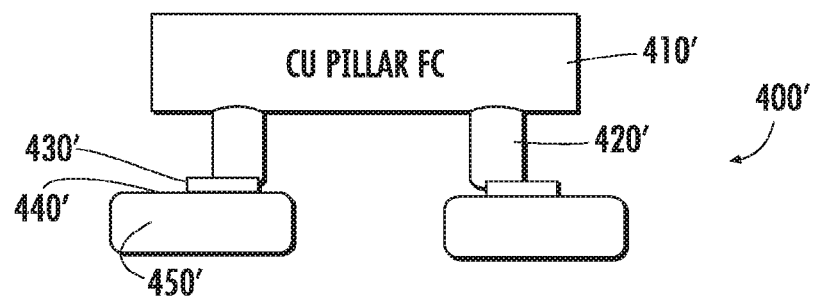
FIG. 13 is another fragmentary side sectional view similar to that shown in FIG. 12, but showing the flip chip that uses a copper pillar in accordance with a non-limiting example.

FIG. 13 is another flip chip device 400' that includes a copper pillar 420' between the encapsulation 410' and the lead 450'. The plated bond wire portion 430' can be formed similar to that shown in FIG. 12 and a copper surface/molding compound adhesion friendly surface 440' is also included.

Figure 14:
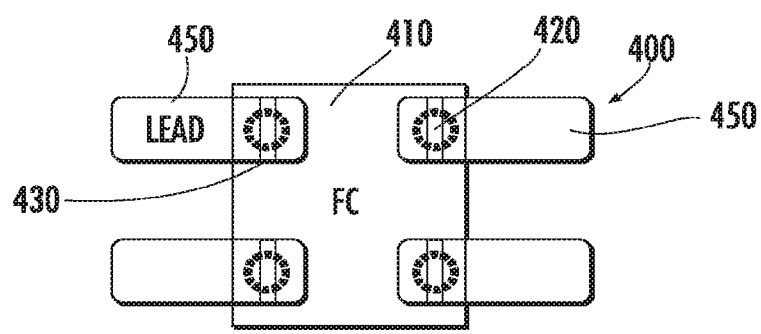
FIG. 14 is a top plan view of the device shown in FIG. 12 in accordance with a non-limiting example.

FIG. 14 is a plan view similar to that shown in FIG. 12 of the flip chip device showing the overall layout in this non-limiting example with a pair of leads 450 on either side.

A method of making an integrated circuit (IC) device includes forming a plurality of leads with each lead including an unplated proximal end comprising a first material, and an unplated distal end comprising the first material. The plated bond wire portion is between the proximal and distal ends and includes the first material and a plating of a second material thereon. The method further includes coupling a plurality of bond wires to an IC die and the plurality of leads so that each bond wire extends between the IC die and the plated bond wire portion of a respective lead. The encapsulation material is formed to surround the IC die and plurality of bond wires so that the unplated proximal end and plated bond wire portion of each lead are covered by the encapsulation material.

Each lead may include an unplated intermediate portion between the plated bond wire portion and the unplated distal end. The encapsulation material may also cover the unplated intermediate portion of each lead. The first material may comprise copper while the second material may comprise silver.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. An integrated circuit (IC) device, comprising:
    an IC die;
    a plurality of leads, each lead of the plurality of leads extending along a lead extension direction and comprising:
        an unplated proximal end comprising a first material;
        an unplated distal end comprising the first material; and
        a bond wire portion between the unplated proximal end and the unplated distal end, the bond wire portion comprising a plurality of plated regions and at least one unplated region, each plated region of the plurality of plated regions comprising the first material and a plating comprising a second material on the first material;
    a plurality of bond wires, each bond wire of the plurality of bond wires extending between the IC die and the bond wire portion of a respective lead; and
    an encapsulation material surrounding the IC die and the plurality of bond wires such that the unplated proximal end and bond wire portion of each lead are covered by the encapsulation material.

2. The IC device of claim 1, wherein:
each lead further comprises an unplated intermediate portion between the bond wire portion and the unplated distal end; and
the encapsulation material also covers the unplated intermediate portion of each lead.

3. The IC device of claim 1, wherein each of the plurality of bond wires comprises the first material.

4. The IC device of claim 1, wherein the first material comprises copper.

5. The IC device of claim 1, wherein the second material comprises silver.

6. The IC device of claim 1, wherein each unplated distal end extends in a range of 100 to 300 microns.

7. The IC device of claim 1, wherein each bond wire portion end extends in a range of 350 to 550 microns.

8. The IC device of claim 1, wherein each lead has a continuous shape devoid of openings.

9. The IC device of claim 1, further comprising a plurality of solder balls, each solder ball connecting to a respective bond wire portion of a respective lead of the plurality of leads, each solder ball formed of a conductive material.

10. The IC device of claim 1, further comprising a plurality of pillars, each pillar connecting to a respective bond wire portion of a respective lead of the plurality of leads, the pillars formed of a conductive material.

11. A method for making an integrated circuit (IC) device, comprising:
forming a plurality of leads, each lead of the plurality of leads extending along a lead extension direction and comprising:
an unplated proximal end comprising a first material;
an unplated distal end comprising the first material; and
a bond wire portion between the unplated proximal end and the unplated distal end, the bond wire portion comprising a plurality of plated regions and at least one unplated region, each plated region of the plurality of plated regions comprising the first material and a plating comprising a second material on the first material;
coupling a plurality of bond wires to an IC die and the plurality of leads so that each bond wire of the plurality of bond wires extends between the IC die and the bond wire portion of a respective lead; and
forming an encapsulation material to surround the IC die and the plurality of bond wires such that the unplated proximal end and the bond wire portion of each lead are covered by the encapsulation material.

12. The method of claim 11, comprising:
forming each lead to have an unplated intermediate portion between the bond wire portion and the unplated distal end; and
forming the encapsulation material to cover the unplated intermediate portion of each lead.

13. The method of claim 11, wherein the first material comprises copper and the second material comprises silver.

14. The method of claim 11, wherein each unplated distal end extends in a range of 100 to 300 microns.

15. The method of claim 11, wherein each bond wire portion end extends in a range of 350 to 550 microns.

16. The method of claim 11, comprising forming each lead of the plurality of leads to have a continuous shape devoid of openings.

17. The method of claim 11, further comprising forming a plurality of solder balls, each solder ball connecting to a respective bond wire portion of a respective lead of the plurality of leads, each solder ball formed of a conductive material.

18. The method of claim 11, further comprising forming a plurality of pillars, each pillar connecting to a respective bond wire portion of a respective lead of the plurality of leads, the pillars formed of a conductive material.

19. An integrated circuit (IC) device, comprising:
an IC die;
a plurality of leads, each lead of the plurality of leads having a planar shape along a plane parallel to a major surface of the IC die and comprising:
a first edge surface and an opposite second edge surface, the second edge surface facing the IC die and the first edge surface facing away from the IC die;
a first portion comprising a first material and being un-plated, the first portion being disposed between the first edge surface and the second edge surface, the first portion comprising a first major surface parallel to the plane;
a second portion comprising the first material and being un-plated, the second portion being disposed between the second edge surface and the first portion, the second portion comprising a second major surface parallel to the plane; and
a third portion comprising the first material and being disposed between the first portion and the second portion, the third portion comprising a third major surface parallel to the plane, the third portion further comprising a first plating layer comprising a second material, the third portion being spaced from the second edge surface by the second portion;
a plurality of bond wires, each bond wire of the plurality of bond wires extending between the IC die and the third portion of a respective lead; and
an encapsulation material surrounding the IC die and the plurality of bond wires such that the second edge surface, the second portion, and the third portion of each lead are covered by the encapsulation material, the encapsulation material partially covering the first portion of each lead of the plurality of leads such that the first portion of each lead of the plurality of leads extends out of the encapsulation material.

20. The IC device of claim 19, wherein at least one lead of the plurality of leads further comprises a fourth portion comprising the first material and disposed between the first portion and the third portion, the fourth portion comprising a fourth major surface parallel to the plane, the fourth portion further comprising a second plating layer comprising the second material.

* * * * *